United States Patent [19]
Howard

[11] Patent Number: 5,851,916
[45] Date of Patent: Dec. 22, 1998

[54] FORMATION OF A SELF-ALIGNED INTEGRATED CIRCUIT STRUCTURES USING PLANARIZATION TO FORM A TOP SURFACE

[75] Inventor: Bradley J. Howard, Boise, Id.

[73] Assignee: Micron Technology, Inc., Boise, Id.

[21] Appl. No.: 552,824

[22] Filed: Nov. 3, 1995

[51] Int. Cl.$^6$ .................................................. H01L 21/302
[52] U.S. Cl. .......................... 438/626; 438/631; 438/633; 438/634
[58] Field of Search ..................................... 438/586, 624, 438/622, 626, 631, 633, 634, 587, 233, 692; 257/758, 760

[56] References Cited

U.S. PATENT DOCUMENTS

| | | | |
|---|---|---|---|
| 4,944,682 | 7/1990 | Cronin et al. | 438/595 |
| 5,229,326 | 7/1993 | Dennison et al. | 438/633 |
| 5,296,400 | 3/1994 | Park et al. | 438/586 |

OTHER PUBLICATIONS

Wolf, S., Silicon Processing, vol. 2, Lattice Prejs, 1990, pp. 194–196.

*Primary Examiner*—T. N. Quach
*Attorney, Agent, or Firm*—Workman, Nydegger & Seeley

[57] ABSTRACT

A improved method is provided for forming self-aligned integrated circuit structures, particularly self-aligned contact structures, by providing, on a substrate, raised structures each including an outermost protective layer, and each having a horizontal upper surface extending between substantially vertical lateral surfaces, said horizontal upper surface being horizontal over the entire area therebetween. An etchable layer is formed over and between said raised structures. A photoresist layer is formed on said etchable layer and patterned. Said etchable layer is then anisotropically etched selective to said protective layer to remove said etchable layer from between selected of said raised structures, said horizontal upper surfaces substantially preventing etching at top outer edges of said raised structures and preserving thereby the integrity of the protective layers. A fill layer is then deposited to fill between said selected of said raised structures, forming thereat structures that are self-aligned to said selected of said raised structures.

30 Claims, 7 Drawing Sheets

FORMATION OF A SELF-ALIGNED INTEGRATED CIRCUIT STRUCTURES USING PLANARIZATION TO FORM A TOP SURFACE

BACKGROUND OF THE INVENTION

1. The Field of the Invention

The present invention relates to semiconductor devices and the manufacture thereof. More particularly, the present invention is directed to a method for forming self-aligned integrated circuit structures employing a protective layer having a horizontal top surface.

2. The Relevant Technology

Self-aligned structures in an integrated circuit may be formed by shielding previously formed structures with a protective layer of a material that resists the etchant which is used to form spaces for the self-aligned structures. The protective layer shields underlying previously formed structures from the etchant, effectively preventing the etchant from etching away around the structures to be protected. Thus the alignment of the mask to the previously formed structures is much less critical, hence the name "self-aligned". Such self-aligned structures allow denser spacing of circuit devices.

For successful formation of self-aligned structures such as self-aligned contact structures, the protective layer must adequately withstand the etchant which forms the spaces in which the self-aligned structures are to be formed. If a protective layer is etched through in the case of self-aligned contacts for example, the contact structures formed subsequently will contact inappropriate areas, resulting in shorted, non-functional circuit devices.

Protective layers over underlying structures are most vulnerable at top edges of the protective layer. Reducing the protective layer's tendency to be etched through at such top edges would thus provide an important advantage, allowing the production of dense self-aligned circuit designs with increased process control and higher yield.

SUMMARY AND OBJECTS OF THE INVENTION

An object of the present invention is to provide an improved method for forming self-aligned integrated circuit structures, said method providing decreased likelihood of etch-through of a protective layer overlying the circuit structures.

Another object of the present invention is to provide an improved method for forming self-aligned integrated circuit structures, said method allowing the production of dense self-aligned circuit designs with increased process control and higher yield.

Another object of the present invention is to provide processes for forming on a substrate a raised structure including an outermost protective layer, said structure having a horizontal upper surface extending between substantially vertical lateral surfaces, said horizontal upward surface being horizontal over the entire area therebetween.

In accordance with the method of the present invention, raised structures each have thereon a vertical protective layer on lateral sides of the raised structure. The surface of the protective layer forms a vertical lateral surface over the raised structure. Each raised structure is provided with a horizontal upper surface extending between the vertical lateral surface. The horizontal upper surface is substantially horizontal over the entire area between the vertical lateral surface which circumscribes the horizontal upper surface. An etchable layer is provided over and between two or more of the raised structures, and a patterned photoresist layer is provided on the etchable layer.

The etchable layer is then etched anisotropically and selectively to the protective layer to form spaces between the raised structures. A fill layer is then deposited to fill the spaces between the raised structures. The material of the fill layer in the spaces is self-aligned to the raised structures. During the anisotropic etch of the etchable layer, the horizontal upper surface of the protective layer of each raised structure provides significantly improved resistance to, or selectivity of, etching at the top edges of the raised structure where the horizontal upper surface meets the vertical lateral surface. By forming a horizontal upper surface of the protective layer, there is an increase in process reliability, control, and yield.

Various planarization processes may be employed to form the horizontal upper surface of the protective layer of the raised structures, including chemical mechanical polishing and simultaneous etching.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

While the present invention will be described in detail with particular reference to self-aligned contact structures, the present invention is applicable to virtually any type of self-aligned integrated circuit structure, as will be appreciated by those of skill in the art.

Figure 1:
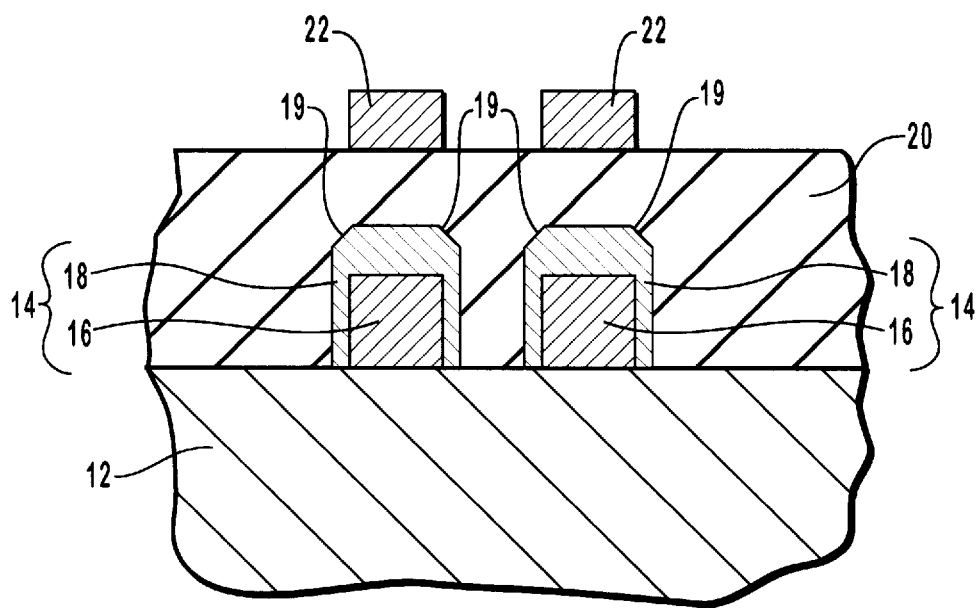
FIG. 1 is a partial cross section of a partially formed integrated circuit according to typical processing.
Figure 2:
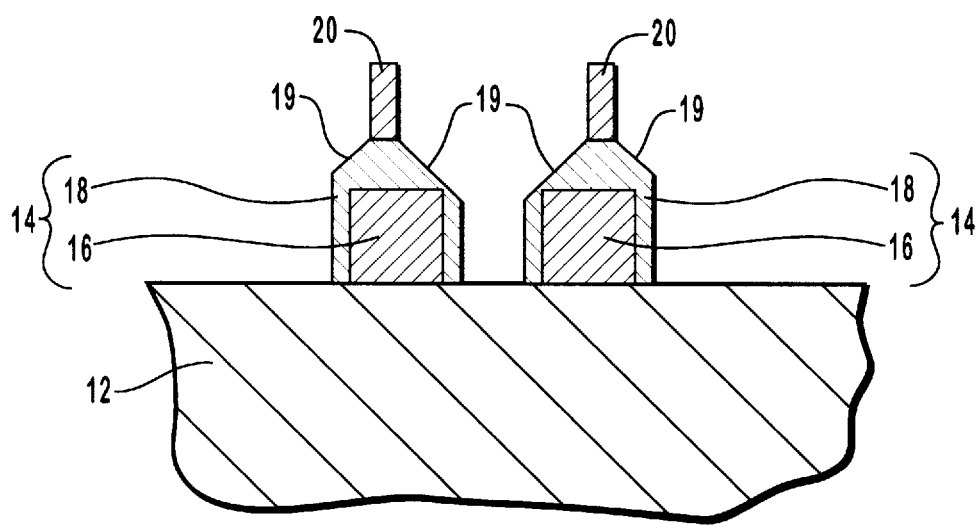
FIG. 2 is the cross section of FIG. 1 after further typical processing.
Figure 3:
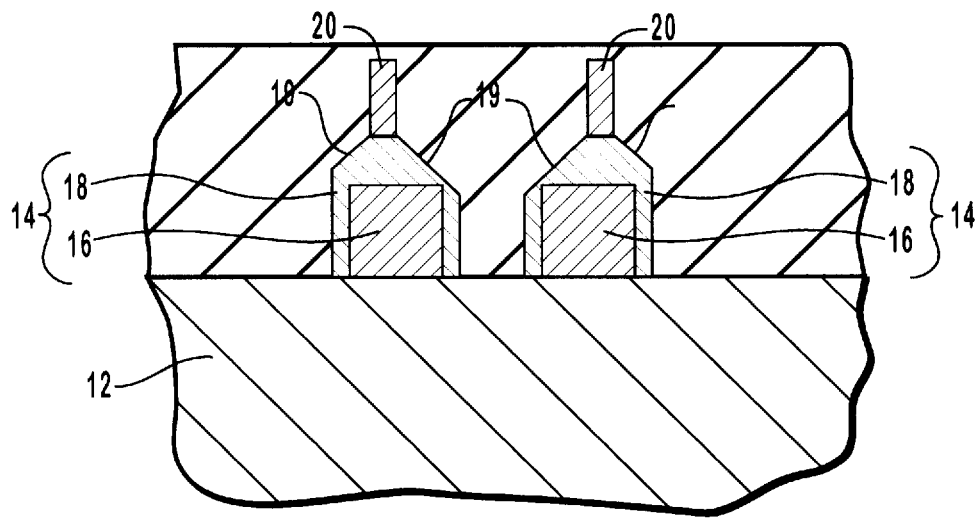
FIG. 3 is the cross section of FIG. 2 after further typical processing.

FIGS. 1–3 illustrate the typical process for forming self-aligned structures.

FIG. 1 is a partial cross section of a partially formed integrated circuit. Raised structures 14 which include underlying structures 16 and protective layers 18 have been formed on a substrate 12. Protective layers 18 have diagonal facets 19 at the top edges thereof. An etchable layer 20 has been deposited over and between raised structures 14, and a photoresist layer 22 has been deposited and patterned upon etchable layer 20.

FIG. 2 is the cross section of FIG. 1 after an anisotropic etch of etchable layer 20 and removal of photoresist layer 22. The anisotropic etch is intended to be selective to protective layers 18, i.e., to not etch protective layers 18, but the top edges of protective layers 18 are etched somewhat nonetheless. Facets 19 have thus been enlarged. The etching of protective layers 18 is not easily controlled, and can result in a breach thereof as seen at breach location 29.

FIG. 3 is the cross section of FIG. 2 after a fill layer 28 has been deposited thereover. If fill layer 28 is a contact plug fill and underlying structures 16 are gate or wordline stacks, for example, then the plug fill will contact the gate stack or wordline stack at breach location 29, resulting in a shorted, non-functional device.

While the physical and/or chemical mechanisms therefor have not been fully ascertained) it has been found that the etching of protective layer 18 at the top edges thereof illustrated in FIGS. 1–3 can be substantially reduced or eliminated by providing protective layer 18 with a horizontal upper surface which extends horizontally between the vertical lateral surfaces of protective layer 18 without any intervening diagonal facets 19 at the junction of these surfaces.

Figure 4:
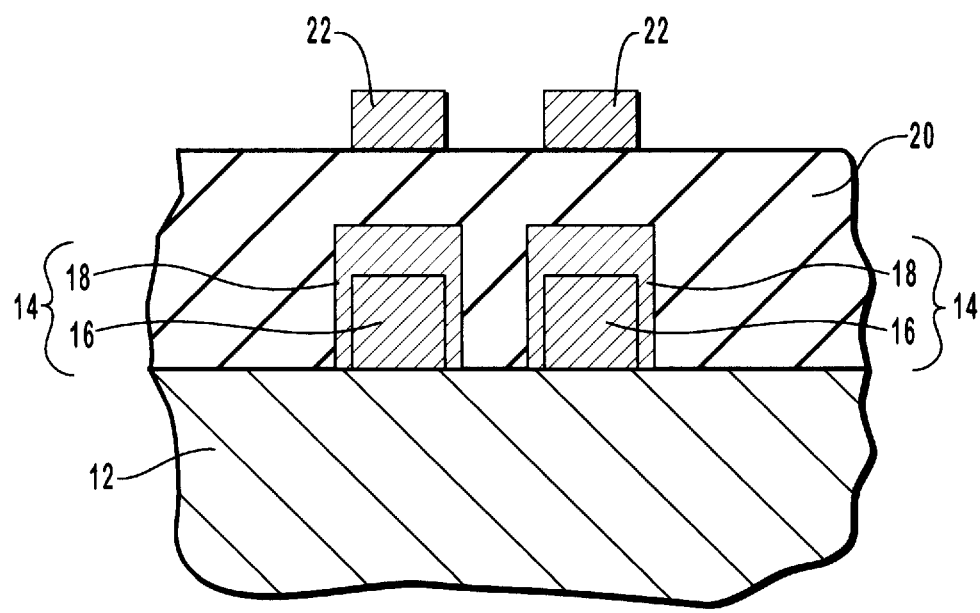
FIG. 4 is a partial cross section of a partially formed integrated circuit according to the method of the present invention.

Accordingly, in the method of the present invention, raised structures 14, each including an underlying structure 16 and a protective layer 18, are formed on a substrate 12 as shown in FIG. 4. Raised structures 14 are each provided with a horizontal upper surface 24 extending between substantially vertical lateral surfaces 26, surface 24 being horizontal over the entire area therebetween. Thus no facets are present at the top edges of protective layers 18 of raised structures 14. An etchable layer 20 has been deposited over substrate 12 and over and between raised structures 14. A photoresist layer 22 has been deposited on etchable layer 20, which etchable layer 22 is then patterned.

Figure 5:
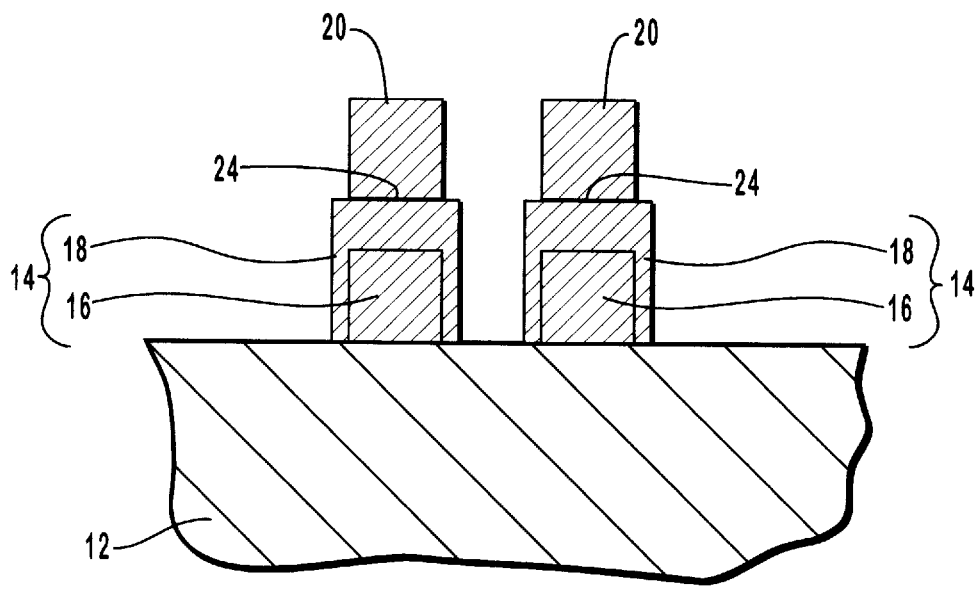
FIG. 5 is the cross section of FIG. 4 after an etch step.

FIG. 5 is the cross section of FIG. 4 after an anisotropic etch of etchable layer 20 selective to protective layer 18, and after removal of photoresist layer 22. Horizontal upper surface 24 has prevented any substantial etching of protective layer 18 at the top edges thereof.

Figure 6:
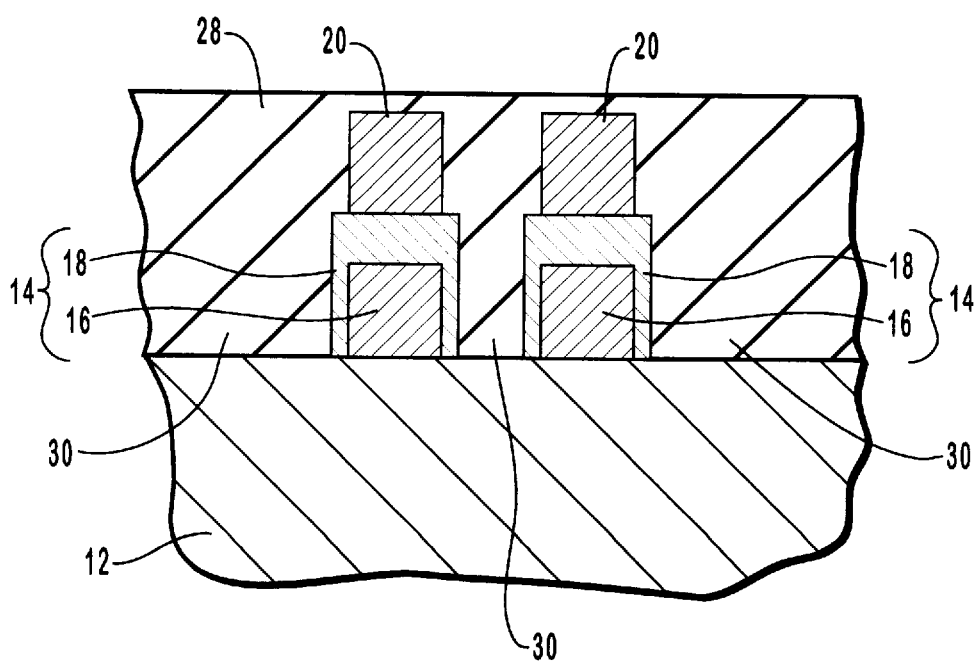
FIG. 6 is the cross section of FIG. 5 after a deposition step.
Figure 7:
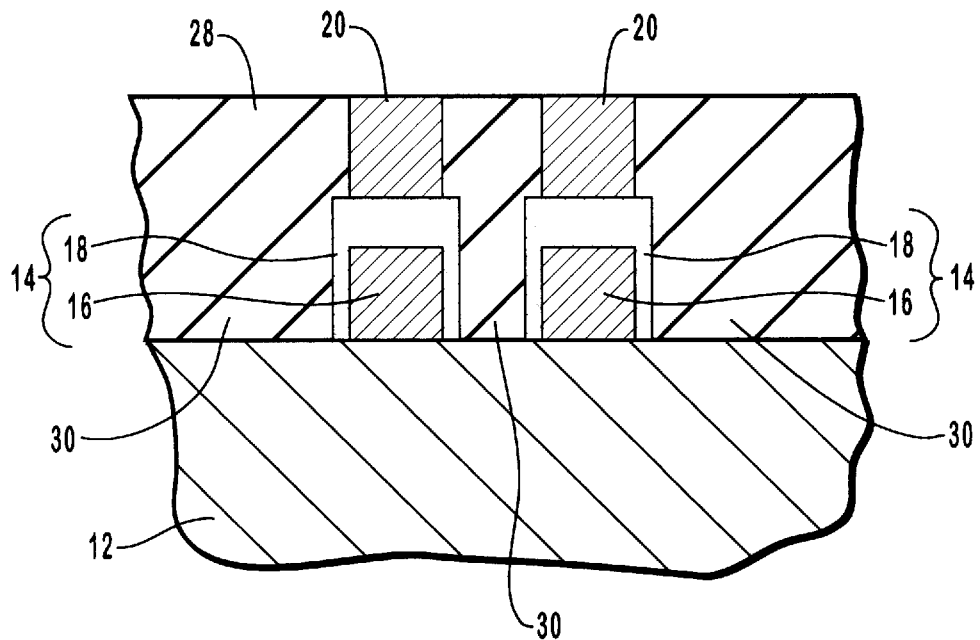
FIG. 7 is the cross section of FIG. 6 after a removal step.

FIG. 6 is the cross section of FIG. 5 after deposition of a fill layer 28. Fill layer 28 will be used to form self-aligned structures 30 which are self-aligned to structures 16. Individual self-aligned structures may then be made separate and isolated one from another by removing the materials on substrate 12 from the top down at least as far as the top of etchable layer 20, resulting in self-aligned structures 30 shown in FIG. 7.

In application of the present invention to the formation of self-aligned contact structures, underlying structures 16 are gate or wordline stacks. Protective layer 18 is preferably silicon nitride, and etchable layer 20 is preferably borophosphorous silica glass (BPSG). The absence of facets at the top edges of nitride protective layer 18 substantially improves the selectivity or resistance thereof to standard anisotropic nitride-selective BPSG etches, resulting in better process control and higher yields in a dense self-aligned integrated circuit design.

While protective layer 18 is preferably silicon nitride for formation of self-aligned contact structures, other materials such as polysilicon or an oxide of silicon may be used to form self-aligned structures according to the method of the present invention.

In the process of the present invention described above with reference to FIGS. 4–7, raised structures 14 each having horizontal upper surface 24 may be provided by any suitable planarization process. Presently preferred methods for providing this feature are illustrated below with reference to FIGS. 8–14.

Figure 8:
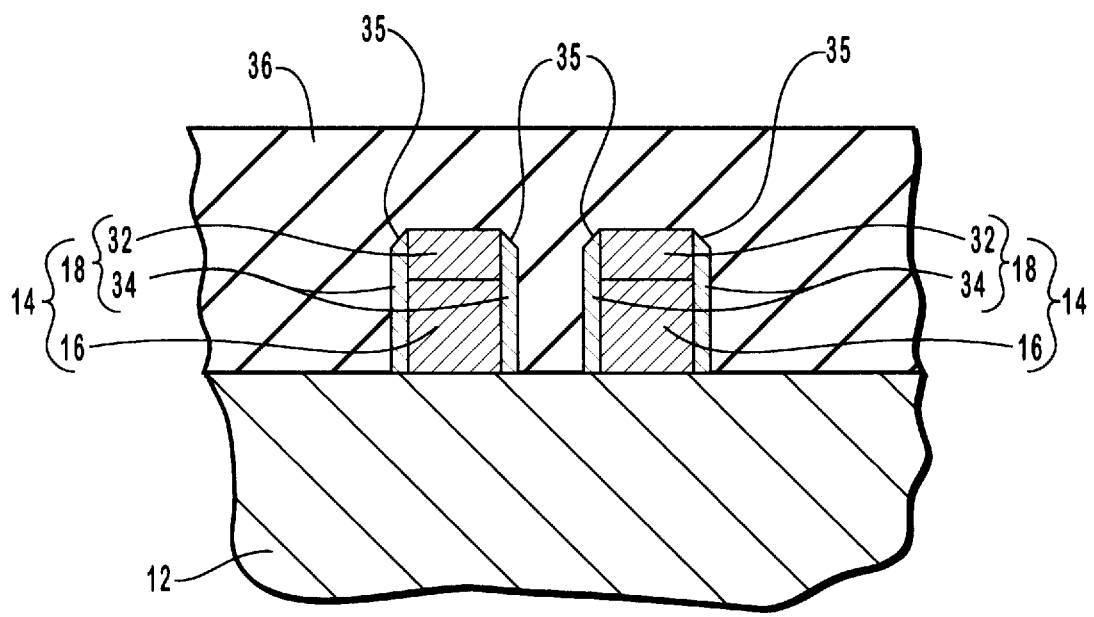
FIG. 8 is a partial cross section of a partially formed integrated circuit according to certain processes of the present invention for providing the structure shown in FIG. 4.

FIG. 8 is a partial cross section of a partially formed integrated circuit. Objects which each include a desired underlying structure 16 and a top layer 32 of a protective material have been formed on substrate 12. Spacers 34 of the same protective material were then formed by deposition and an anisotropic etch, which process results in a facet 35 at the top outside facing edge of each spacer 34. Each top layer 32 together with its associated spacers 34 forms a protective layer 18. The entirety of each underlying structure 16 and its associated protective layer 18 constitutes a raised structure 14. A first layer 36 of an etchable material has been deposited between and over raised structures 14.

Figure 9:
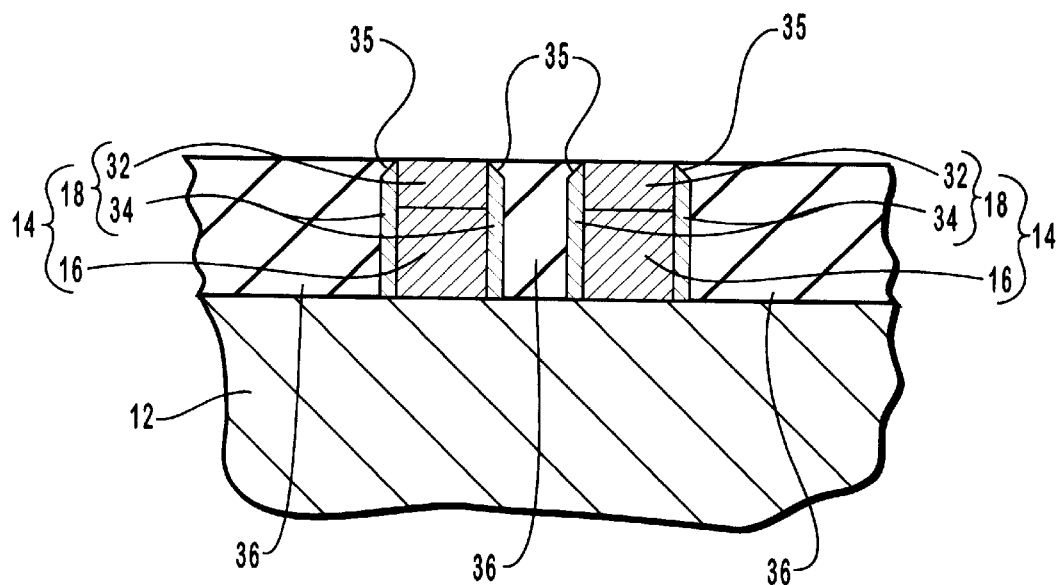
FIG. 9 is the cross section of FIG. 8 after a chemical mechanical polishing step.
Figure 10:
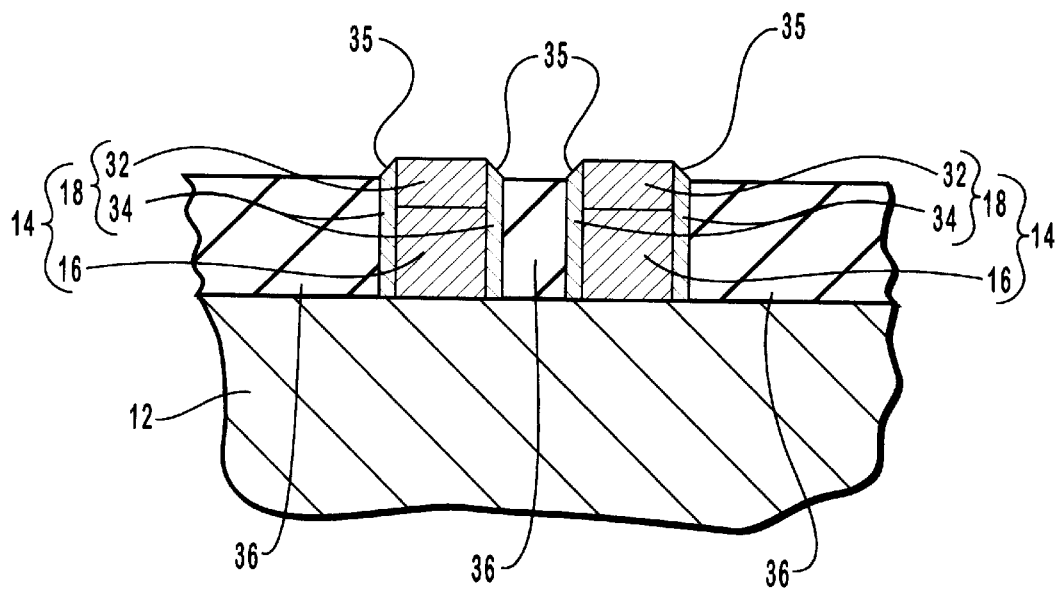
FIG. 10 is the cross section of FIG. 9 after an etch step.
Figure 11:
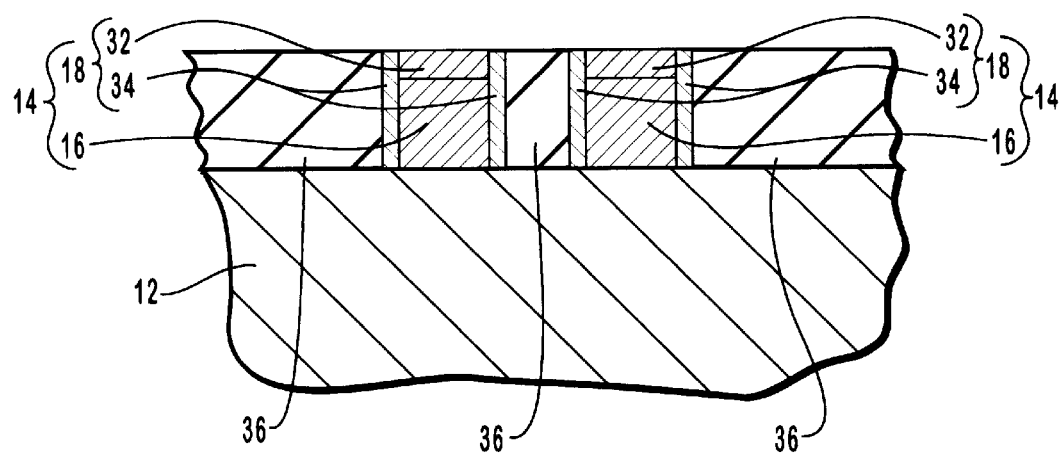
FIG. 11 is the cross section of FIG. 10 after chemical mechanical polishing step according to one process of the present invention for providing the structure shown in FIG. 4, the cross section of FIG. 13 (described below) after a chemical mechanical polishing step according to another process of the present invention for providing the structure shown in FIG. 4, and the cross section of FIG. 9 after a simultaneous etch step according to yet another process of the present invention for providing the structure shown in FIG. 4.
Figure 12:
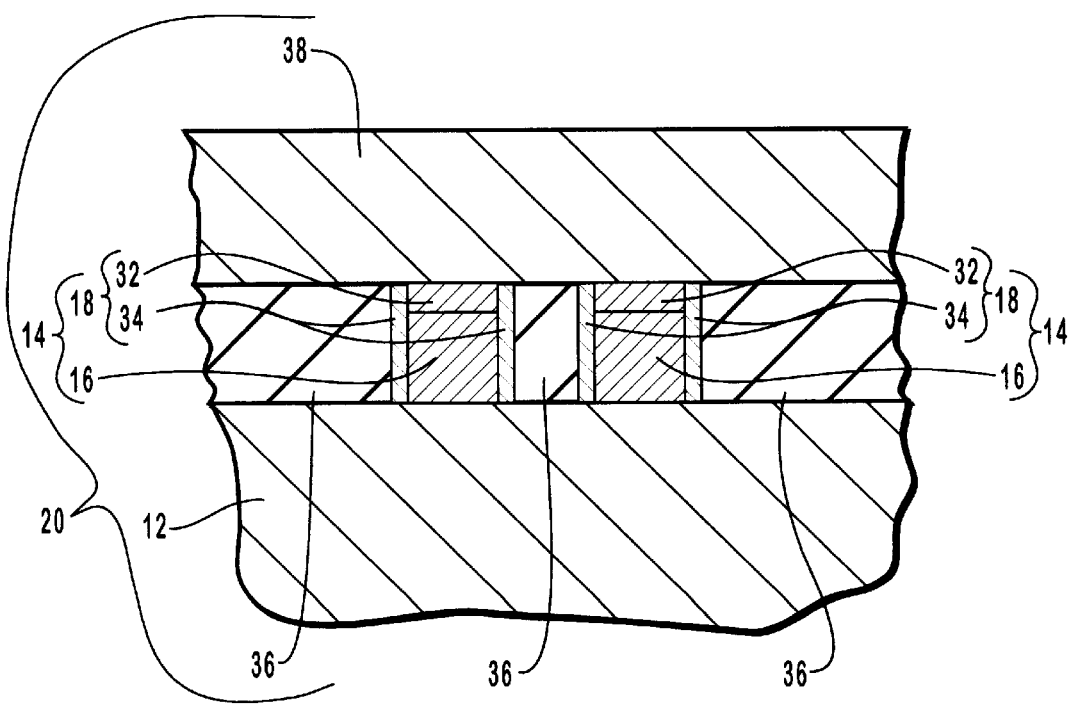
FIG. 12 is the cross section of FIG. 11 after a deposition step, resulting in structure corresponding to the structure of FIG. 4.

According to one presently preferred process for providing raised structures 14 each having a horizontal upper surface, first layer 36 shown in FIG. 8 is removed by chemical mechanical polishing (CMP) down to the top of top layers 32, resulting in the structure shown in FIG. 9. First layer 36 is then etched back to below the lowest extent of facets 35, as shown in FIG. 10. The upwardly protruding portions of top layers 32 and spacers 34 are then removed by CMP, resulting in the structure shown in FIG. 11. A second layer 38 of the same etchable material is then deposited over first layer 36 and raised structures 14, resulting in the structure shown in FIG. 12. First and second layers 36, 38 of the etchable material together form etchable layer 20. Processing may then proceed as described above in relation to FIGS. 4–7.

In application of the above process seen in FIGS. 8–12 to the formation of self-aligned contact structures, the protective material is nitride, the etchable material is BPSG, and the first layer of BPSG is deposited and reflowed to form a planar upper surface. The CMP of the first layer is a nitride-selective CMP, such that the CMP inherently stops on the top of top layers 32. First layer 36 is etched back by an appropriately timed HF dip. A nitride CMP is then used to remove the protruding portions of top layers 32 and spacers 34.

Figure 13:
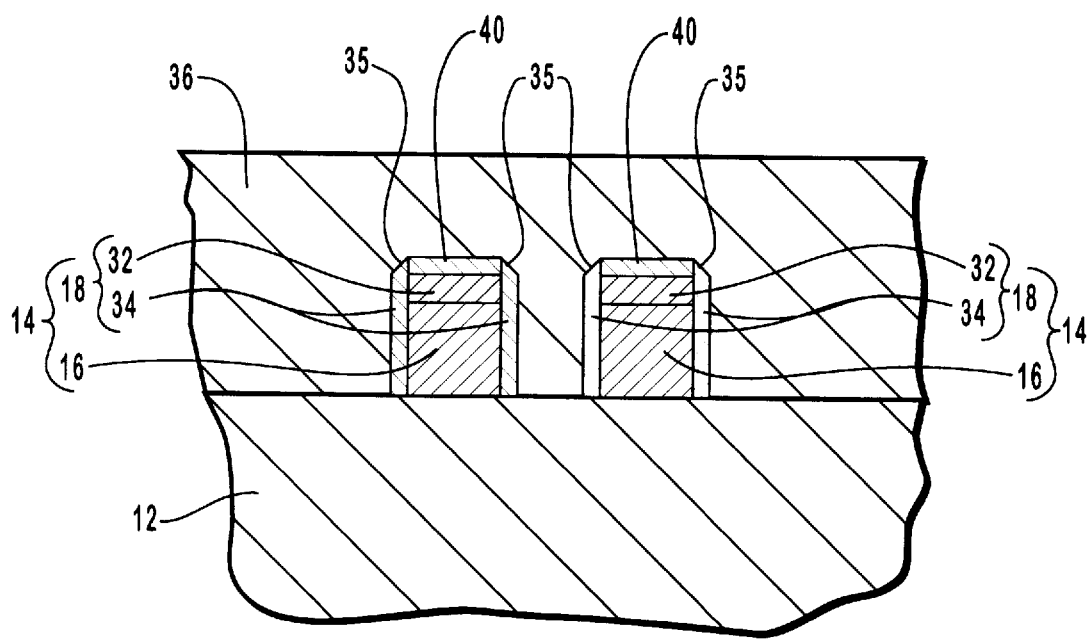
FIG. 13 is a partial cross section of a partially formed integrated circuit according to a process of the present invention for providing the structure shown in FIG. 4.

In another presently preferred process for providing raised structures 14 each having a horizontal upper surface, objects which each include a desired underlying structure 16 and a top layer 32 of a protective material with a cap 40 thereon have been formed on a substrate 12, as shown in FIG. 13. Spacers of like protective material are then formed by deposition and an anisotropic etch, which process results in spacers 34 with a facet 35 at the top outside facing edge of each. Each top layer 32 together with its associated spacers 34 forms a protective layer 18. The entirety of each underlying structure 16 and its associated protective layer 18 constitutes a raised structure 14. A first layer 36 of an etchable material is deposited between and over raised structures 14. CMP is then used to remove all materials on substrate 12 from the top downward to the top surface of top layers 32. This is preferably achieved by a CMP selective to the protective material of which top layers 32 and spacers 34 are formed. Caps 40 are removed by the chemical and mechanical action of the CMP. The thin portions of spacers 34 which extend above the top surfaces of top layers 32 are removed by the mechanical action of the CMP, resulting in the structure shown in FIG. 11. A second layer 38 of the same etchable material is then deposited over the structure of FIG. 11, resulting in the structure shown in FIG. 12. Processing may then proceed as described above in relation to FIGS. 4–7.

In application of the above process to the formation of self-aligned contact structures, the protective material is preferably silicon nitride, the etchable material is preferably BPSG, and the cap is preferably an oxide of silicon. The first layer of BPSG is deposited and reflowed to form a planar upper surface.

According yet another presently preferred process for providing raised structures 14 each having a horizontal upper surface, first layer 36 shown in FIG. 8 is removed by chemical mechanical polishing (CMP) down to the top of top layers 32, resulting in the structure shown in FIG. 9. First layer 36 is then etched back simultaneously with top layer 32 and spacers 34 to below the lowest extent of facets 35, resulting directly in the structure shown in FIG. 11. A second layer 38 of the same etchable material is then deposited over first layer 36 and raised structures 14 resulting in the structure shown in FIG. 12. Processing may then proceed as described above in relation to FIGS. 4–7.

In a presently preferred application of the above process to the formation of self-aligned contact structures, the protective material is nitride, and the etchable material is BPSG. The first layer 36 of BPSG is deposited and then reflowed to form a planar upper 8 surface. The CMP of the first layer is a nitride-selective CMP, such that the CMP inherently stops on the top of top layers 32. First layer 36, top layers 32, and spacers 34 are simultaneously etched back by a dry etch including a mixture of $CF_4$ and $CHF_3$.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming a structure comprising:
   forming a raised structure on a substrate, said raised structure including a protective layer having a upper surface that extends to a lateral surface below the upper surface, the lateral surface projecting towards the substrate, said raised structure being adjacent to and overlaid by a removable layer; wherein said raised structure is formed by:
   forming an object on said substrate including a top layer of a protective material;
   forming a spacer of said protective material laterally enclosing said object, said spacer of said protective material having diagonal facets at top outward facing edges thereof;
   forming a first layer of a first material over and between said object enclosed by said spacer;
   planarizing said first layer of said first material down to the top surface of said object;
   removing said first layer of said first material at least down to the lowest extent of said facets;
   planarizing said object and said spacer down to the level of said first layer of said first material to remove said facets; and
   forming a second layer of said first material over said object enclosed by said spacer and said first layer of said first material;
   depositing a layer of photoresist over said removable layer;
   patterning said layer of photoresist;
   removing said removable layer adjacent to said raised structure without breaching said protective layer; and
   forming a fill layer over said substrate and said raised structure thereon.

2. The method of claim 1 in which said protective layer comprises polysilicon.

3. The method of claim 1 in which said protective layer comprises silicon nitride.

4. The method of claim 1 in which said protective layer comprises silicon nitride and said removable layer comprises BPSG.

5. The method of claim 1, further comprising the step of removing said fill layer down to at least the top of said etchable layer to form selectively isolated self-aligned structures.

6. The method of claim 1, wherein:
   said spacer of said protective material with said object including said top layer of said protective material together form said raised structure;
   said spacer of said protective material with said top layer of said protective material together form said protective layer;
   said first layer of said first material with said second layer of said first material together form said layer of first material;
   said object comprises a gate stack;
   said protective material comprises silicon nitride;
   said first material comprises BPSG; and
   forming said first layer of said first material over said object enclosed by said spacers comprises:
   forming a first layer of BPSG over said object enclosed by said spacer, and
   reflowing said first layer of BPSG.

7. The method of claim 6, wherein removing said first layer of said first material at least down to the lowest extent of said facets comprises a hydrofluoric dip.

8. The method of claim 6, wherein planarizing said first layer of said first material down to the top surface of said object comprises nitride-selective chemical mechanical polishing.

9. The method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface, the lateral surface projecting towards the semiconductor substrate, said plurality of raised structures being separated by and overlaid by an etchable layer, wherein said plurality of raised structures are formed by:
    forming objects on said substrate each including a top layer of a protective material;
    forming spacers of said protective material laterally enclosing said objects, said spacers of said protective material each having diagonal facets at top outward facing edges thereof;
    depositing a first layer of an etchable material over and between said objects enclosed by said spacers;
    chemical mechanical polishing said first layer of said etchable material down to the top surfaces of said objects;
    etching said first layer of said etchable material at least down to the lowest extent of said facets;
    chemical mechanical polishing said objects and said spacers down to the level of said first layer of said etchable material to remove said facets; and
    depositing a second layer of said etchable material over said objects enclosed by said spacers and said first layer of said etchable material, whereby said spacers of said protective material, together with said objects including said top layers of said protective material, together form said raised structures, and said spacers of said protective material, with associated of said top layers of said protective material, together form said protective layer, and said first layer of said etchable material, with said second layer of said etchable material, together form said etchable layer;
depositing a layer of photoresist over said etchable layer;
patterning said layer of photoresist;
anisotropically etching said etchable layer selective to said protective layer to remove said etchable layer from between selected of said raised structures without breaching said protective layer; and
depositing at least one fill layer over said substrate and all structures thereon to fill said spaces and form thereby self-aligned structures.

10. The method of claim 9 in which:
(a) said objects comprise gate stacks;
(b) said protective material comprises silicon nitride;
(c) said etchable material comprises BPSG; and
(d) said step of depositing a first layer of said etchable material over and between said objects enclosed by said spacers comprises:
    (i) depositing a first layer of BPSG over and between said objects enclosed by said spacers, and
    (ii) reflowing said first layer of BPSG.

11. The method of claims 10 in which the step of etching said first layer of said etchable material at least down to the lowest extent of said facets comprises a hydrofluoric dip.

12. The method of claim 10 in which said step of chemical mechanical polishing said first layer of said etchable material down to the top surfaces of said objects comprises nitride-selective chemical mechanical polishing.

13. The method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface, the lateral surface projecting towards the semiconductor substrate, said plurality of raised structures being separated by and overlaid by an etchable layer, wherein said plurality of raised structures are formed by:
    forming on said substrate objects each including a top layer of a protective material with a cap thereon;
    forming spacers of said protective material laterally enclosing said objects, said spacers each having a diagonal facet at a top outward facing edge thereof, the lowest extent of said facet being no lower than the top of said top layer;
    depositing a first layer of an etchable material over and between said objects enclosed by said spacers;
    chemical mechanical polishing said first layer of said etchable material and all other material on said semiconductor substrate downward to the top surfaces of said top layers, removing thereby said caps and portions of said spacers including said facets; and
    depositing a second layer of said etchable material over said objects enclosed by said spacers and said first layer of said etchable material; whereby said spacers of said protective material, together with said objects including said top layers of said protective material, form said raised structures, and said spacers of said protective material, together with said top layers of said protective material, form said protective layer, and said first layer of said etchable material, together with said second layer of said etchable material, together form said etchable layer;
depositing a layer of photoresist over said etchable layer:
patterning said layer of photoresist:
anisotropically etching said etchable layer selective to said protective layer to remove said etchable layer from between selected of said raised structures without breaching said protective layer: and
depositing at least one fill layer over said substrate and all structures thereon to fill said spaces and form thereby self-aligned structures.

14. The method of claim 13 in which:
(a) said objects comprise gate stacks;
(b) said protective material comprises silicon nitride;
(c) said etchable material comprises BPSG;
(d) said caps comprise an oxide of silicon; and
(e) said step of depositing a first layer of said etchable material over and between said objects enclosed by said spacers comprises:
    (i) depositing a first layer of BPSG over and between said objects enclosed by said spacers, and
    (ii) reflowing said first layer of BPSG.

15. The method of claim 14 in which chemical mechanical polishing step is a nitride-selective chemical mechanical polishing step.

16. The method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface the lateral surface projecting towards the semiconductor substrate said plurality of raised structures being separated by and overlaid by an etchable layer, wherein said plurality of raised structures are formed by:

forming objects on said substrate each including a top layer of a protective material;

forming spacers of said protective material laterally enclosing said objects, said spacers each having a diagonal facet at a top outward facing edge thereof;

depositing a first layer of an etchable material over and between said objects enclosed by said spacers;

chemical mechanical polishing said first layer of said etchable material down to the top surfaces of said objects;

etching simultaneously and at substantially the same rate said first layer of said etchable material, together with said top layers and said spacers of said protective material, downward to at least the lowest extent of said facets; and depositing a second layer of said etchable material over said objects enclosed by said spacers and said first layer of said etchable material; whereby said spacers of said protective material, together with said objects including said top layers of said protective material, form said raised structures, and said spacers of said protective material, together with said top layers of said protective material, form said protective layer, and said first layer of said etchable material, together with said second layer of said etchable material, form said etchable layer;

depositing a layer of photoresist over said etchable layer, patterning said layer of photoresist:

anisotropically etching said etchable layer selective to said protective layer to remove said etchable layer from between selected of said raised structures without breaching said protective layer: and depositing at least one fill layer over said substrate and all structures thereon to fill said spaces and form thereby self-aligned structures.

17. The method of claim 16 in which:

(a) said objects comprise gate stacks;

(b) said protective material comprises silicon nitride;

(c) said etchable material comprises BPSG; and (f) said step of depositing a first layer of said etchable material over and between said objects enclosed by said spacers comprises:

(i) depositing a first layer of BPSG over and between said objects enclosed by said spacers, and (ii) reflowing said first layer of BPSG.

18. The method of claim 17 wherein the step of etching simultaneously and at substantially the same rate said first layer of said etchable material, together with said top layers and said spacers of said protective material, downward to below the level of said facets comprises dry etching in a mixture comprising $CF_4$ and $CHF_3$.

19. The method of claim 17 wherein the step of chemical mechanical polishing said first layer of said etchable material down to the top surfaces of said objects comprises nitride-selective chemical mechanical polishing.

20. A method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface, the lateral surface projecting towards the semiconductor substrate, said plurality of raised structures being separated by and overlaid by an etchable layer; said plurality of raised structures on said semiconductor substrate being formed by steps comprising:

forming objects on said substrate each including a top layer of a protective material;

forming spacers of said protective material laterally enclosing said objects, said spacers of said protective material each having diagonal facets at top outward facing edges thereof;

depositing a first layer of an etchable material over and between said objects enclosed by said spacers;

chemical mechanical polishing said first layer of said etchable material down to the top surfaces of said objects;

etching said first layer of said etchable material at least down to the lowest extent of said facets;

chemical mechanical polishing said objects and said spacers down to the level of said first layer of said etchable material to remove said facets; and depositing a second layer of said etchable material over said objects enclosed by said spacers and said first layer of said etchable material; whereby said spacers of said protective material, together with said objects including said top layers of said protective material, together form said raised structures, and said spacers of said protective material, with associated of said top layers of said protective material, together form said protective layer, and said first layer of said etchable material, with said second layer of said etchable material, together form said layer of etchable material;

depositing a layer of photoresist over said etchable layer; patterning said layer of photoresist;

anisotropically etching said etchable layer selective to said protective layer to remove said etchable layer from between selected of said raised structures without breaching said protective layer; and depositing at least one fill layer over said substrate and all structures thereon to fill said spaces and form thereby self-aligned structures.

21. The method of claim 20 in which:

(a) said objects comprise gate stacks;

(b) said protective material comprises silicon nitride;

(c) said etchable material comprises BPSG; and (d) said step of depositing a first layer of said etchable material over and between said objects enclosed by said spacers comprises the steps of:

(i) depositing a first layer of BPSG over and between said objects enclosed by said spacers, and (ii) reflowing said first layer of BPSG.

22. A method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface, the lateral surface projecting towards the semiconductor substrate, said plurality of raised structures being separated by and overlaid by an etchable layer; the plurality of raised structures being formed on said semiconductor substrate by steps comprising:

forming on said substrate objects each including a top layer of a protective material with a cap thereon;

forming spacers of said protective material laterally enclosing said objects, said spacers each having a diagonal facet at a top outward facing edge thereof, the lowest extent of said facet being no lower than the top of said top layer;

depositing a first layer of an etchable material over and between said objects enclosed by said spacers;

chemical mechanical polishing said first layer of said etchable material and all other material on said semiconductor substrate downward to the top surfaces of said top layers, removing thereby said caps and portions of said spacers including said facets; and depositing a second layer of said etchable material over said objects enclosed by said spacers and said first layer of said etchable material; whereby said spacers of said protective material, together with said objects including said top layers of said protective material, form said raised structures, and said spacers of said protective material, together with said top layers of said protective material, form said protective layer, and said first layer of said etchable material, together with said second layer of said etchable material, together form said etchable layer;

depositing a layer of photoresist over said etchable layer;

patterning said layer of photoresist;

anisotropically etching said etchable layer selective to said protective layer to remove said etchable layer from between selected of said raised structures without breaching said protective layer; and depositing at least one fill layer over said substrate and all structures thereon to fill said spaces and form thereby self-aligned structures.

23. The method of claim 22 which:
(a) said objects comprise gate stacks;
(b) said protective material comprises silicon nitride;
(c) said etchable material comprises BPSG;
(d) said caps comprise an oxide of silicon; and
(e) said step of depositing a first layer of said etchable material over and between said objects enclosed by said spacers comprises the steps of:
(i) depositing a first layer of BPSG over and between said objects enclosed by said spacers, and
(ii) reflowing said first layer of BPSG.

24. A method of forming self-aligned integrated circuit structures on a semiconductor substrate comprising the steps of:

forming a plurality of raised structures on said semiconductor substrate, each raised structure including a protective layer having a upper surface that is horizontal within and extends to a lateral surface below and circumscribing the upper surface, the lateral surface projecting towards the semiconductor substrate, said plurality of raised structures being separated by and overlaid by an etchable layer; the plurality of said raising structures being formed by steps comprising:

forming objects on said substrate each including a top layer of a protective material;

forming spacers of said protective material laterally enclosing said objects, said spacers each having a diagonal facet at a top outward facing edge thereof;

depositing a first layer of an etchable material over and between said objects enclosed by said spacers;

chemical mechanical polishing said first layer of said etchable material down to the top surfaces of said objects;

etching simultaneously and at substantially the same rate said first layer of said etchable material, together with said top layers and said spacers of said protective material, downward to at least the lowest extent of said facets; and depositing a second layer of said etchable material over said objects enclosed by said spacers and said first layer of said etchable material; whereby said spacers of said protective material, together with said objects including said top layers of said protective material, form said raised structures, and said spacers of said protective material, together with said top layers of said protective material, form said protective layer, and said first layer of said etchable material, together with said second layer of said etchable material, form said etchable layer;

depositing a layer of photoresist over said etchable layer;

patterning said layer of photoresist;

anisotropically etching said etchable layer selective to said protective layer to remove said etchable layer from between selected of said raised structures without breaching said protective layer; and depositing at least one fill layer over said substrate and all structures thereon to fill said spaces and form thereby self-aligned structures.

25. The method of claim 24 in which:
(a) said objects comprise gate stacks;
(b) said protective material comprises silicon nitride;
(c) said etchable material comprises BPSG; and
(f) said step of depositing a first layer of said etchable material over and between said objects enclosed by said spacers comprises the steps of:
(i) depositing a first layer of BPSG over and between said objects enclosed by said spacers, and
(ii) reflowing said first layer of BPSG.

26. The method of claim 25 wherein the step of etching simultaneously and at substantially the same rate said first layer of said etchable material, together with said top layers and said spacers of said protective material, downward to below the level of said facets comprises dry etching in a mixture comprising $CF_4$ and $CHF_3$.

27. A method of forming a structure comprising:

forming a raised structure on a substrate, said raised structure including a protective layer having a upper surface that extends to a lateral surface below the upper surface, the lateral surface projecting towards the substrate, said raised structure being adjacent to and overlaid by a removable layer; wherein said raised structure is formed by:

forming on said substrate an object including a top layer of a protective material with a cap thereon;

forming a spacer of said protective material laterally enclosing said object, said spacer having diagonal facets at top outward facing edges thereof, the lowest extent of said facet being no lower than the top of said top layer;

forming a first layer of a first material over said object enclosed by said spacer;

planarizing said first layer of said first material on said substrate downward to the top surfaces of said top layer, removing thereby said cap and portions of said spacer including said facets; and forming a second layer of said first material over said object enclosed by said spacer and said first layer of said first material;

depositing a layer of photoresist over said removable layer;

patterning said layer of photoresist;

removing said removable layer adjacent to said raised structure without breaching said protective layer; and forming a fill layer over said substrate and said raised structure thereon.

28. The method as defined in claim 27, wherein:

said spacer of said protective material together with said object including said top layer of said protective material form said raised structure;

said spacer of said protective material together with said top layer of said protective material form said protective layer; and said first layer of said first material with said second layer of said first material together form said removable layer.

29. A method of forming a structure comprising:

forming a raised structure on a substrate, said raised structure including a protective layer having a upper surface that extends to a lateral surface below the upper surface, the lateral surface projecting towards the substrate, said raised structure being adjacent to and overlaid by a removable layer; wherein said raised structure is formed by:

forming an object on said substrate including a top layer of a protective material;

forming a spacer of said protective material laterally enclosing said object, said spacer having diagonal facets at a top outward facing edge thereof;

forming a first layer of a first material over said object enclosed by said spacer;

planarizing said first layer of said first material down to the top surface of said object;

removing simultaneously and at substantially the same rate said first layer of said first material together with said top layer and said spacer of said protective material downward to at least the lowest extent of said facets; and forming a second layer of said etchable material over said object enclosed by said spacer and said first layer of said first material;

depositing a layer of photoresist over said removable layer;

patterning said layer of photoresist;

removing said removable layer adjacent to said raised structure without breaching said protective layer; and forming a fill layer over said substrate and said raised structure thereon.

30. The method as defined in claim 29, wherein:

said spacer of said protective material together with said object including said top layers of said protective material form said raised structure;

said spacer of said protective material together with said top layers of said protective material form said protective layer; and said first layer of said first material together with said second layer of said first material form said removable layer.

* * * * *

UNITED STATES PATENT AND TRADEMARK OFFICE
CERTIFICATE OF CORRECTION

PATENT NO. : 5,851,916
DATED : Dec. 22, 1998
INVENTOR(S) : Bradley J. Howard

It is certified that error appears in the above-identified patent and that said Letters Patent is hereby corrected as shown below:

Col. 3, line 45, after "fully" change "ascertained)" to --ascertained,--

Col. 3, line 65, after "layer" change "22" to --20--

Col. 5, line 36, after "According" insert --to--

Signed and Sealed this

Twenty-ninth Day of August, 2000

Attest:

Q. TODD DICKINSON

Attesting Officer

Director of Patents and Trademarks